(12) United States Patent
Dai et al.

(10) Patent No.: US 10,999,961 B2
(45) Date of Patent: May 4, 2021

(54) POSITIONING DEVICE

(71) Applicants: Tyco Electronics (Shanghai) Co. Ltd., Shanghai (CN); TE Connectivity Corporation, Berwyn, PA (US); Measurement Specialties (China) Ltd., Shenzhen (CN); Shenzhen AMI Technology Co., Ltd., Shenzhen (CN)

(72) Inventors: Zhiyong Dai, Shanghai (CN); Dandan Zhang, Shanghai (CN); Roberto Francisco-Yi Lu, Bellevue, WA (US); Songping Chen, Shenzhen (CN); Xiangyou Hou, Shenzhen (CN); Qinglong Zeng, Shenzhen (CN); Lvhai Hu, Shanghai (CN); Yun Liu, Shanghai (CN)

(73) Assignees: Tyco Electronics (Shanghai) Co. Ltd., Shanghai (CN); TE Connectivity Corporation, Berwyn, PA (US); Measurement Specialties (China) Ltd., Shenzhen (CN); Shenzhen AMI Technology Co., Ltd., Shenzhen (CN)

( * ) Notice: Subject to any disclaimer, the term of this patent is extended or adjusted under 35 U.S.C. 154(b) by 268 days.

(21) Appl. No.: 16/169,444

(22) Filed: Oct. 24, 2018

(65) Prior Publication Data
US 2019/0124802 A1 Apr. 25, 2019

(30) Foreign Application Priority Data
Oct. 24, 2017 (CN) .......................... 201711000548.6

(51) Int. Cl.
  *H05K 13/04* (2006.01)
  *H05K 13/00* (2006.01)
  *H05K 3/00* (2006.01)

(52) U.S. Cl.
  CPC ....... *H05K 13/0015* (2013.01); *H05K 3/0008* (2013.01); *H05K 13/04* (2013.01); *H05K 2203/167* (2013.01); *Y10T 29/5313* (2015.01)

(58) Field of Classification Search
  USPC ......... 29/729, 739, 714, 740, 743, 757, 759, 29/809, 832, 834
  See application file for complete search history.

(56) References Cited

U.S. PATENT DOCUMENTS 6,971,157 B1 * 12/2005 Yoshida ............. H05K 13/0452
  29/739
10,368,447 B2 * 7/2019 Yamamuro ............... B25J 15/04

* cited by examiner

*Primary Examiner* — Thiem D Phan
(74) *Attorney, Agent, or Firm* — Barley Snyder

(57) ABSTRACT

A positioning device including a support tab, two pairs of sliding blocks slidably mounted in the support table, a positioning plate extending vertically from on a top of each sliding block, a base on which the support table is supported, a cylinder installed in a chamber of the base, a ball received in the cylinder, a piston rod slidably mounted in the cylinder that pushes the ball to move upward in a vertical direction, so that the ball drives the two pairs of sliding blocks to move away from each other in the first horizontal direction and the second horizontal direction, respectively, until the positioning plates of the two pairs of sliding blocks abut against four inner walls of the opening of the circuit board, respectively, to allow the electronic device to be received in a positioning slot defined by the positioning plates, and a release mechanism.

13 Claims, 6 Drawing Sheets

POSITIONING DEVICE

CROSS-REFERENCE TO RELATED APPLICATION

This application claims the benefit of the filing date under 35 U.S.C. § 119(a)-(d) of Chinese Patent Application No. 201711000548.6 filed on Oct. 24, 2017.

FIELD OF THE INVENTION

The present disclosure relates to a positioning device and, more particularly, to a positioning device adapted to centrally position an electronic device in an opening of a circuit board.

BACKGROUND OF THE INVENTION

In the related art, it is sometimes necessary to solder an electronic device on a circuit board in a sinking manner, that is, a main body of the electronic device is at least received in an opening of the circuit board and soldering legs of the electronic device are supported on a surface of the circuit board and soldered to electrical contacts of the circuit board.

In order to improve the soldering quality of the electronic device, the main body of the electronic device should be centrally positioned in the opening of the circuit board. To ensure that the main body of the electronic device may be centrally positioned in the opening in the circuit board, the size of the opening of the circuit board should be formed to precisely match the size of the main body of the electronic device. However, such a solution is not feasible in practical applications because there is manufacturing error in the size of the main body of the electronic device and if the size of the main body of the electronic device is slightly larger than the size of the opening of the circuit board, it may result in the impossibility of the main body of the electronic device being accommodated in the opening of the circuit board and precise control of the size of the main body of the electronic device and the size of the opening of the circuit board may result in a sharp increase in manufacturing cost.

In order to reduce the manufacturing cost, in the related art, the size of the opening of the circuit board is generally formed to be much larger than the size of the main body of the electronic device, so that the main body of the electronic device may always be accommodated in the opening of the circuit board. However, this in turn leads to another problem in that it is not easy to centrally position the main body of the electronic device in the opening of the circuit board, which reduces the positioning accuracy and the soldering quality of the electronic device.

SUMMARY

In accordance with the present invention, a positioning device, adapted to centrally position an electronic device in an opening of a circuit board, includes a support table on which the circuit board is supported and two pairs of sliding blocks slidably mounted in the support table and movable in a first horizontal direction and a second horizontal direction perpendicular to the first horizontal direction, respectively. Also included in a positioning device constructed in accordance with the present invention are a plurality of positioning plates individually extending vertically from the top of each sliding block, a base on which the support table is supported, a cylinder in the base, a ball in the cylinder, and a piston rod slidably mounted in the cylinder. The piston rod pushes the ball to move upward in a vertical direction and drive the two pairs of sliding blocks to move away from each other in the first horizontal direction and the second horizontal direction, respectively, until the positioning plates of the two pairs of sliding blocks abut against the inner walls of the opening of the circuit board, respectively, to allow the electronic device to be received in a positioning slot defined by the positioning plates. A positioning device constructed in accordance with the present invention further includes a release mechanism that drives the ball to move downward in the vertical direction to allow the two pairs of sliding blocks to be moved toward each other in the first horizontal direction and the second horizontal direction, so that the positioning plates drive the electronic device received in the positioning slot to move toward a center of the opening.

BRIEF DESCRIPTION OF THE DRAWINGS

The above and other features of the present invention will become more apparent by describing in detail exemplary embodiments thereof with reference to the accompanying drawings, in which.

DETAILED DESCRIPTION OF THE EMBODIMENTS

Figure 1:
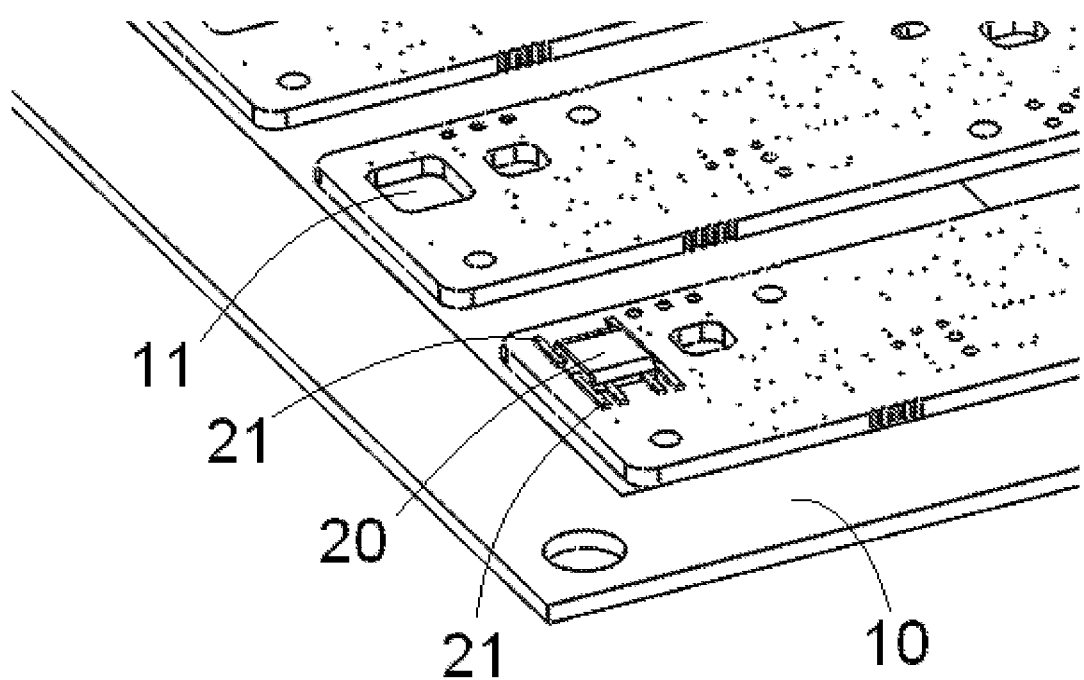
FIG. 1 shows a schematic view of a circuit board and an electronic device soldered on the circuit board according to an exemplary embodiment of the present invention.

Exemplary embodiments of the present invention will be described hereinafter in detail with reference to the attached drawings, wherein the like reference numerals refer to the like elements. It should be understood that the description to the embodiments of the present invention in conjunction with the attached drawings is to convey a general concept of the present invention to the person of ordinary skill in the art, rather than to limit the present invention to the described exemplary embodiments.

Furthermore, in the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
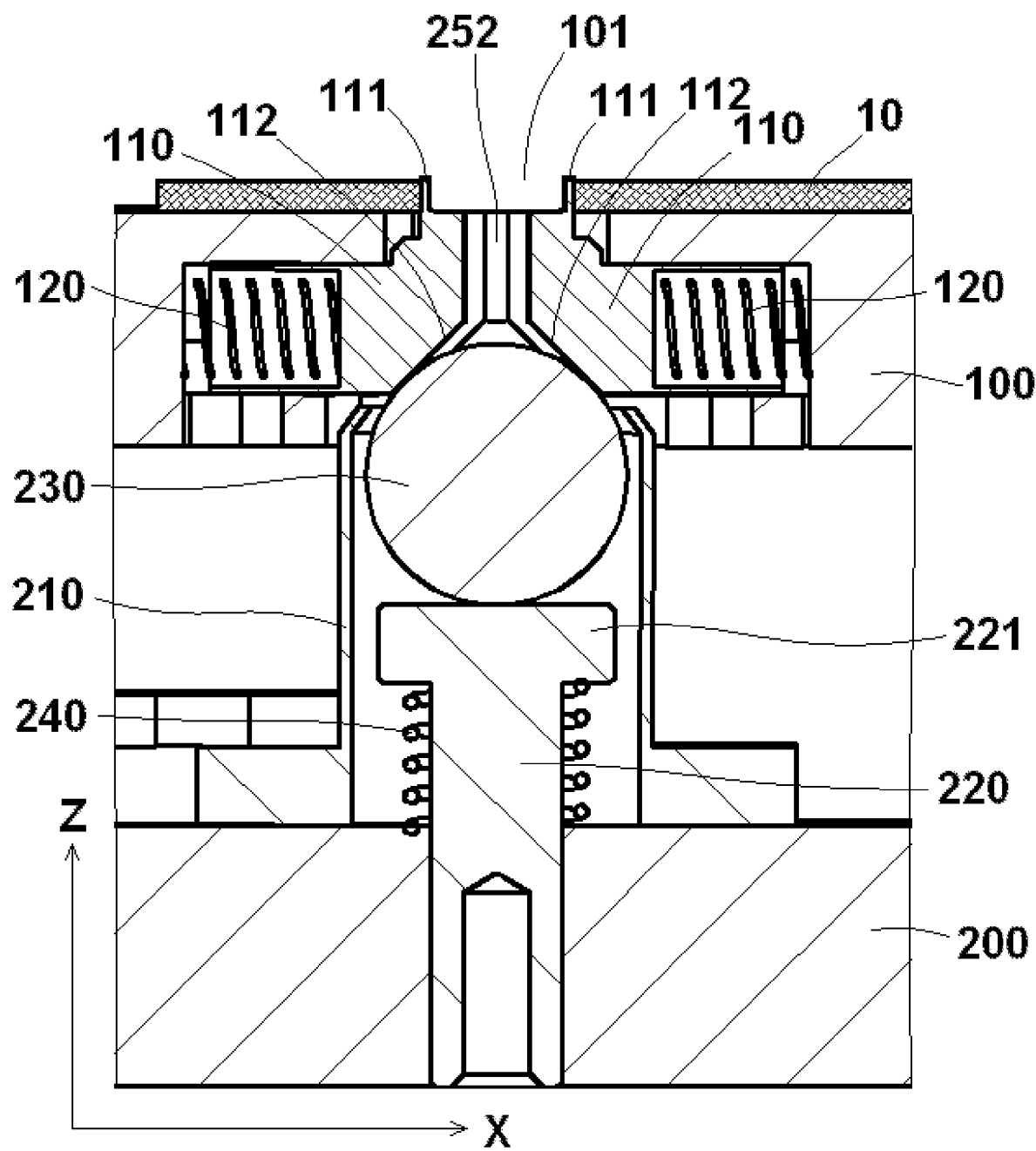
FIG. 2 shows a sectional view of a positioning device according to an exemplary embodiment of the present invention in which a pair of sliding blocks opposite to each other in a first horizontal direction are shown and a ball lies in a work position.
Figure 3:
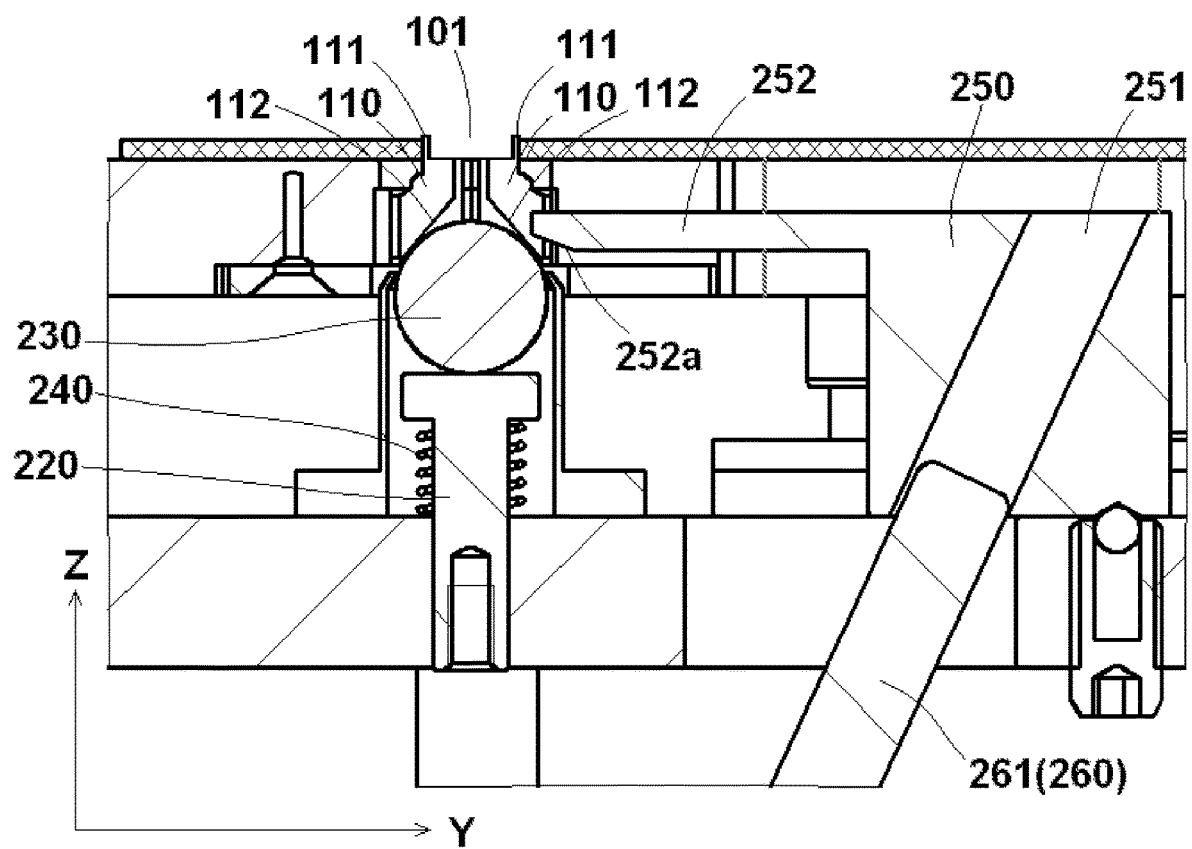
FIG. 3 shows a sectional view of the positioning device according to an exemplary embodiment of the present invention in which a pair of sliding blocks opposite to each other in a second horizontal direction are shown and the ball lies in the work position.

As shown in FIGS. 1, 2, and 3, in an exemplary embodiment of the present invention, the positioning device is adapted to centrally position an electronic device 20 in an opening 11 of a circuit board 10. The positioning device mainly includes a support table 100, two pairs of sliding blocks 110, a base 200, a cylinder 210, a piston rod 220, a ball 230, and a release mechanism 250, 260.

As shown in FIGS. 1, 2, and FIG. 3, in an exemplary embodiment of the present invention, the circuit board 10 is supported on the support table 100. The two pairs of sliding blocks 110 are slidably mounted in the support table 100 and are movable in the first horizontal direction X and a second horizontal direction Y perpendicular to the first horizontal direction X, respectively. As shown in FIGS. 2 and 3, one pair of sliding blocks 110 of the two pairs of sliding blocks 110 are opposite to each other and movable with respect to each other in the first horizontal direction X and the other pair of two pairs of sliding blocks 110 are opposite to each other and movable with respect to each in the second horizontal direction Y.

As shown in FIGS. 1, 2, and 3, in an exemplary embodiment of the present invention, the support table 100 is supported on the base 200. The cylinder 210 is in a chamber of the base 200. The piston rod 220 is slidably mounted in the cylinder 210 and is movable up and down in a vertical direction Z. The ball 230 is in the cylinder 210 and is capable of being moved upward to a work position (the position as shown by FIGS. 2 and 3), where the ball 230 is brought into contact with the sliding blocks 110 in the vertical direction Z under the push of the piston rod 220.

Figure 5:
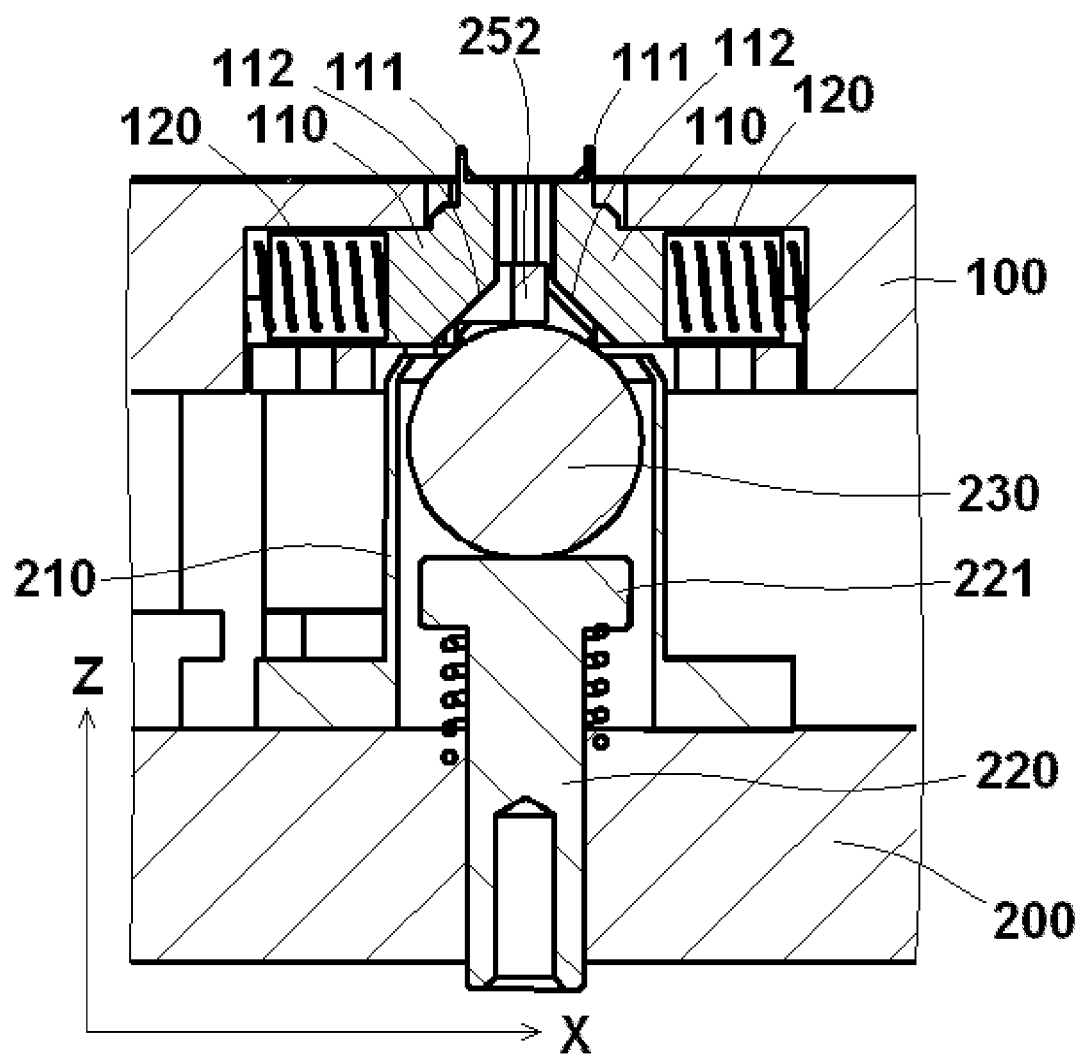
FIG. 5 shows a sectional view of the positioning device according to an exemplary embodiment of the present invention in which the pair of sliding blocks opposite to each other in the first horizontal direction are shown and the ball lies in a release position.
Figure 6:
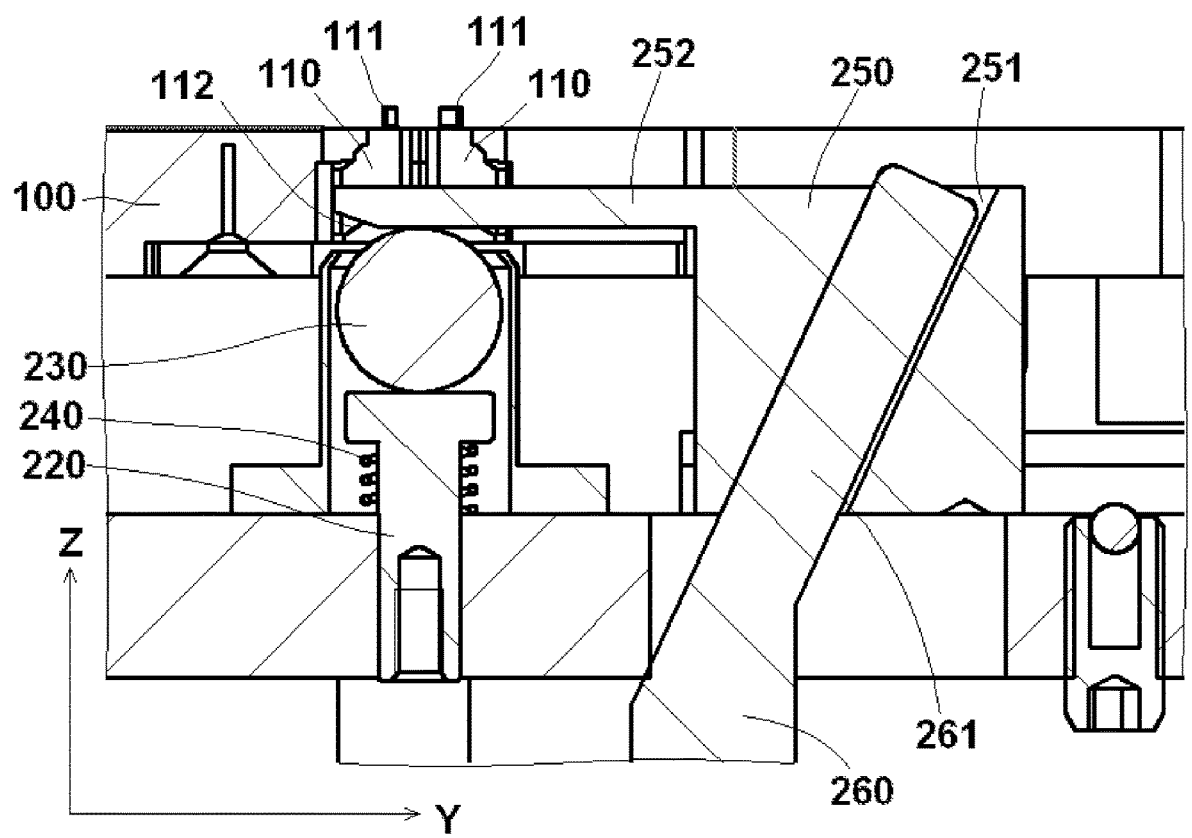
FIG. 6 shows a sectional view of the positioning device according to an exemplary embodiment of the present invention in which the pair of sliding blocks opposite to each other in the second horizontal direction are shown and the ball lies in the release position.

FIG. 5 shows a sectional view of the positioning device according to an exemplary embodiment of the present invention in which the pair of sliding blocks 100 opposite to each other in the first horizontal direction X are shown and the ball 230 lies in a release position. FIG. 6 shows a sectional view of the positioning device according to an exemplary embodiment of the present invention in which the pair of sliding blocks 110 opposite to each other in the second horizontal direction Y are shown and the ball 230 lies in the release position.

As shown in FIGS. 1, 2, 3, 5, and 6, in an exemplary embodiment of the present invention, a plurality of positioning plates 111 extend individually vertically from the top of each sliding block 110. When the ball 230 is moved toward the work position under the push of the piston rod 220, the ball 230 pushes the two pairs of sliding blocks 110 to move away from each other in the first horizontal direction X and the second horizontal direction Y, respectively, until the positioning plates 111 of the two pairs of sliding blocks 110 abut against four inner walls of the opening 11 of the circuit board 10, respectively. In this case, a positioning slot defined by the positioning plates 111 is large enough to easily receive the electronic device 20 therein.

In an illustrated embodiment of the present invention, a slope surface 112 is on the bottom of each sliding block 110 and the ball 230 is capable of abutting against the slope surfaces 112 of the two pairs of sliding blocks 110 at the same time when in the work position, so that the ball 230 may smoothly push the two pairs of sliding blocks 110 to move away from each other in the first horizontal direction X and the second horizontal direction Y, respectively.

Figure 4:
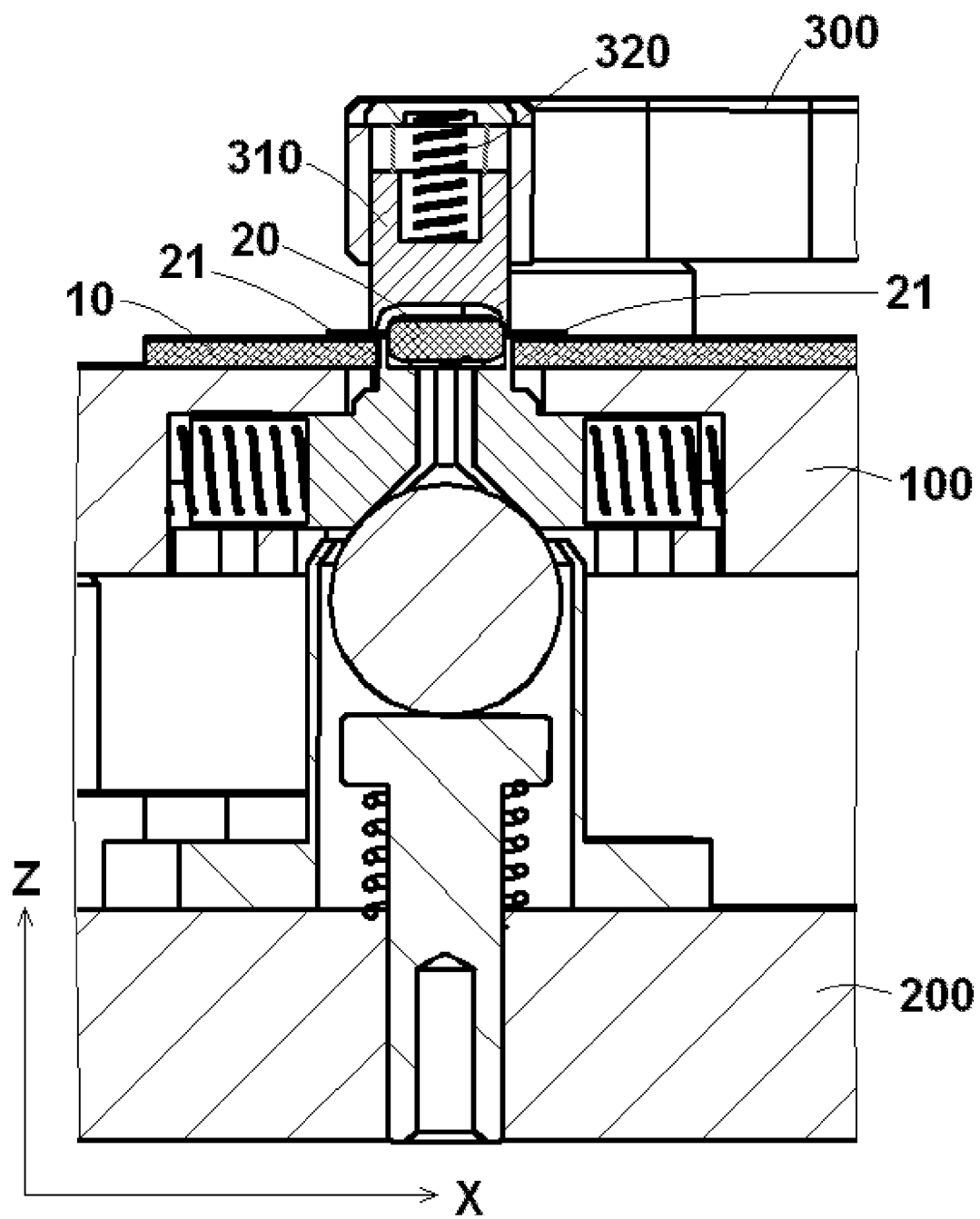
FIG. 4 shows a sectional view of the positioning device according to an exemplary embodiment of the present invention in which the pair of sliding blocks opposite to each other in the first horizontal direction and a pressing device are shown, and the ball lies in the work position.

FIG. 4 shows a sectional view of the positioning device according to an exemplary embodiment of the present disclosure in which the pair of sliding blocks 110 opposite to each other in the first horizontal direction X and a pressing device are shown and the ball 230 lies in the work position. As shown in FIGS. 2, 3, and 4, in an exemplary embodiment of the present invention, the electronic device 20 is received and positioned in a positioning slot 101 defined by the positioning plates 111 after the positioning plates 111 abut against the inner walls of the opening 11 of the circuit board 10.

As shown in FIGS. 5 and 6, in an exemplary embodiment of the present invention, the release mechanism 250, 260 drives the ball 230 to move downward to the release position where the ball 230 is separated from the sliding blocks 110, in the vertical direction Z, to allow the two pairs of sliding blocks 110 to move toward each other in the first horizontal direction X and the second horizontal direction Y, such that the positioning plates 111 drive the electronic device 20 into a positioning slot 101 and toward a center of the opening 11. Thereby, the electronic device may be centrally positioned in the opening of the circuit board, reducing the positioning error of the electronic device, increasing the positioning precision of the electronic device, and improving the welding quality of the electronic device.

As shown in FIGS. 2, 3, 4, 5, and 6, in an exemplary embodiment of the present invention, the positioning device further includes four restoring springs 120 in the support table 100 that push against the sliding block 110, respectively. The ball 230 drives against the elastic forces of the four restoring springs 120 causing the two pairs of sliding blocks 110 to move away from each other in the first horizontal direction and the second horizontal direction. When the ball 230 is moved from the work position toward the release position under the push of the release mechanism 250, 260, the two pairs of sliding blocks 110 are moved toward each other in the first horizontal direction X and the second horizontal direction Y under the push of the restoring springs 120, such that the positioning plates 111 are moved from inner walls of the opening 11 of the circuit board 10, respectively, and drive the electronic device 20 in a positioning slot 101 to move toward the center of the opening 11 until a balance is achieved between elastic forces applied on each pair of sliding blocks 110 by the restoring springs 120. In this way, the electronic device may be centrally positioned in the opening of the circuit board.

As shown in FIGS. 2, 3, 4, 5, and 6, in an exemplary embodiment of the present invention, the positioning device further includes a pushing spring 240, which is in the cylinder 210 and biases the piston rod 220 upward in the vertical direction Z so as to drive the piston rod 220 to move upward in the vertical direction Z and thus push the ball 230 to the work position through the piston rod 220. In this way, the ball 230 may push the two pairs of sliding blocks 110 to move away from each other in the first horizontal direction X and the second horizontal direction Y, respectively, against the four restoring springs 120. It is appreciated that an elastic force applied on the ball 230 by the pushing spring 240 is greater than that applied by the four restoring springs 120, so that the pushing spring 240 may push the ball 230 to move upward against the four restoring springs 120.

As shown in FIGS. 2, 3, 4, 5, and 6, in an exemplary embodiment of the present invention, a top of the piston rod 220 has a flange 221 and the pushing spring 240 is sleeved on the piston rod 220 and abuts against a bottom surface of the flange 221.

As shown in FIGS. 2, 3, 4, 5, and 6, in an exemplary embodiment of the present invention, the release mechanism 250, 260 includes: a first release slider 250 and a second release slider 260. The first release slider 250 is slidably mounted in the base 200 and is moveable in the second horizontal direction Y. The second release slider 260 is slidably mounted in the base 200 and is movable in the vertical direction Z.

As shown in FIGS. 2, 3, 4, 5, and 6, in an exemplary embodiment of the present invention, the first release slider 250 has an inclined chute 251 and a pressing finger 252 which extends in the second horizontal direction Y and is between a pair of sliding blocks 110 opposite to each other in the first horizontal direction X and has an inclined pressing end surface 252a for driving the ball 230 at an end thereof.

As shown in FIGS. 2, 3, 4, 5, and 6, in an exemplary embodiment of the present invention, the second release slider 260 has a sliding plate 261 which extends obliquely and is slidably in the inclined chute 251 such that when the second release slider 260 is moved upward in the vertical direction Z, the second release slider 260 pushes the pressing finger 252 of the first release slider 250 to move toward the ball 230 in the second horizontal direction Y so as to gradually push the ball 230 downward through the inclined pressing end surface 252a and move the ball 230 from the work position to the release position where the ball 230 is separated from the sliding blocks 110. In this case, the four restoring springs 120 may drive the two pairs of sliding blocks 110 to be moved toward each other in the first horizontal direction X and the second horizontal direction Y.

As shown in FIGS. 2, 3, 4, 5, and 6, in an exemplary embodiment of the present invention, when the second release slider 260 is moved downward in the vertical direction Z, the second release slider 260 pushes the pressing finger 252 of the first release slider 250 to move away from the ball 230 in the second horizontal direction Y until the pressing finger 252 is separated therefrom, such that the ball 230 may be moved upwardly from the release position to the work position under the push of the pushing spring 240 in order to push the two pairs of sliding blocks 110 to move away from each other in the first horizontal direction X and the second horizontal direction Y, respectively, against the four restoring springs 120.

As shown in FIGS. 2, 3, 4, 5, and 6, in an exemplary embodiment of the present invention, the positioning device further includes a pressing device 300, 310, 320 that presses the electronic device 20 onto the circuit board 10.

As shown in FIGS. 2, 3, 4, 5, and 6, in an exemplary embodiment of the present invention, the electronic device 20 includes a main body and a plurality of soldering legs 21 extending horizontally outward from the main body. When the electronic device 20 is pressed on the circuit board 10, the main body of the electronic device 20 is received in the opening 11 of the circuit board 10 while the soldering legs 21 are supported on the surface of the circuit board 10.

As shown in FIGS. 2, 3, 4, 5, and 6, in an exemplary embodiment of the present invention, the pressing device 300, 310, 320 mainly includes: a mounting bracket 300, a pressing block 310, and a pressing spring 320. The pressing block 310 is slidably mounted on the mounting bracket 300 and is capable of sliding in the vertical direction Z. The pressing spring 320 is mounted on the mounting bracket 300 and applies a vertical-downward press force to the pressing block 310 so as to press the electronic device 20 onto the circuit board 10.

According to an exemplary embodiment of the present invention, the circuit board 10 has a plurality of first positioning holes (not shown), the mounting bracket 300 has a plurality of second positioning holes (not shown) associated with the first positioning holes, and the support table 100 has a plurality of positioning pins. The positioning pins pass through the first positioning holes and the second positioning holes, respectively, so as to position the circuit board 10 and the mounting bracket 300 on the support table 100.

According to an exemplary embodiment of the present invention, the base 200 has a positioning shaft (not shown) and the support table 100 has a positioning hole (not shown). The positioning shaft passes through the positioning hole so as to position the support table 100 on the base 200.

According to an exemplary embodiment of the present invention, the electronic device has a light emitting diode.

It should be appreciated those skilled in this art that the above embodiments of the present invention are all exemplary embodiments of the present invention and many modifications may be made to the above embodiments of the present invention by those skilled in this art and various features described in different embodiments of the present invention may be freely combined with each other without conflicting in configuration or principle.

Although the present invention has been described with reference to the attached drawings, the embodiments of the present invention disclosed in the attached drawings are intended to describe the preferred embodiments of the present invention and should not be construed as a limitation to the present invention.

Although several embodiments of the general concept of the present invention have been shown and described, it will be appreciated by those skilled in the art that various changes or modifications may be made in these embodiments without departing from the principles and spirit of the disclosure, the scope of which is defined in the claims and their equivalents.

As used herein, term "comprising" or "having" should be understood as not excluding other elements or steps, and term "a" or "an" should be understood as not excluding plural elements or steps.

What is claimed is:

1. A positioning device adapted to centrally position an electronic device in an opening of a circuit board, the positioning device comprising:
   a support table on which the circuit board is supported;
   two pairs of sliding blocks slidably mounted in the support table and movable in a first horizontal direction and a second horizontal direction perpendicular to the first horizontal direction, respectively;
   a plurality of positioning plates individually extending vertically from the top of each sliding block;
   a base on which the support table is supported;
   a cylinder in the base;
   a ball in the cylinder;
   a piston rod slidably mounted in the cylinder that pushes the ball to:
   (a) move upward in a vertical direction, and
   (b) drive the two pairs of sliding blocks to move away from each other in the first horizontal direction and the second horizontal direction, respectively, until the positioning plates of the two pairs of sliding blocks abut against the inner walls of the opening of the circuit board, respectively, to allow the electronic device to be received in a positioning slot defined by the positioning plates; and
   a release mechanism that drives the ball to move downward in the vertical direction to allow the two pairs of sliding blocks to be moved toward each other in the first horizontal direction and the second horizontal direction, so that the positioning plates drives the electronic device received in the positioning slot to move toward a center of the opening.

2. The positioning device according to claim 1, wherein bottom of each sliding block has a slope surface and the ball abuts against the slope surfaces of the two pairs of sliding blocks at the same time.

3. The positioning device according to claim 1,
    (a) further including four restoring springs in the support table that individually push against the sliding blocks, and
    (b) wherein the ball drives against the elastic forces of the four restoring springs and the two pairs of sliding blocks to move the two pairs of sliding blocks away from each other in the first horizontal direction and the second horizontal direction.

4. The positioning device according to claim 3, further including a pushing spring in the cylinder and biasing the piston rod upward in the vertical direction against the elastic forces of the four restoring springs to drive the piston rod to move upward in the vertical direction and push the ball to a work position where the presence of the ball affects the sliding blocks through the piston rod.

5. The positioning device according to claim 4, wherein:
    (a) the top of the piston rod has a flange, and
    (b) the pushing spring is sleeved on the piston rod and abuts against a bottom surface of the flange.

6. The positioning device according to claim 4, wherein the release mechanism includes:
    (a) a first release slider mounted in the base:
        (1) moveable in the second horizontal direction, and
        (2) having
            (i) an inclined chute, and
            (ii) a pressing finger extending in the second horizontal direction between a pair of sliding blocks opposite to each other in the first horizontal direction with an end of the pressing finger having an inclined pressing end surface, and
    (b) a second release slider:
        (1) mounted in the base,
        (2) movable in the vertical direction, and
        (3) having:
            (i) a sliding plate extending obliquely and slidably received in the inclined chute in response to upward movement of the second release slider in the vertical direction,
            (ii) the pressing finger of the first release slider moving toward the ball in the second horizontal direction, so that the ball is driven to move downward gradually through the inclined pressing end surface from the work position to a release position, where the ball is separated from the sliding blocks, and the two pairs of sliding blocks are allowed to be moved toward each other in the first horizontal direction and the second horizontal direction by the four restoring springs.

7. The positioning device according to claim 6, wherein in response to downward movement of the second release slider in the vertical direction, the second release slider pushes the pressing finger of the first release slider to move away from the ball in the second horizontal direction until the pressing finger is separated therefrom, such that the ball is moveable upwardly from the release position to the work position under the push of the pushing spring.

8. The positioning device according to claim 1, wherein the positioning device further includes a pressing device that presses the electronic device onto the circuit board.

9. The positioning device according to claim 8, wherein:
    (a) the electronic device has a main body and a plurality of soldering legs extending horizontally outward from the main body, and
    (b) when the electronic device is pressed on the circuit board, the main body of the electronic device is received in the opening of the circuit board while the soldering legs are supported on the surface of the circuit board.

10. The positioning device according to claim 9, wherein the pressing device comprises:
    (a) a mounting bracket,
    (b) a pressing block mounted on the mounting bracket and slidable in the vertical direction, and
    (c) a pressing spring mounted on the mounting bracket and applies a vertical-downward press force to the pressing block so as to press the electronic device onto the circuit board.

11. The positioning device according to claim 10, wherein:
    (a) the circuit board has a plurality of first positioning holes,
    (b) the mounting bracket has a plurality of second positioning holes corresponding to the first positioning holes, respectively,
    (c) the support table has a plurality of positioning pins, and
    (d) the positioning pins pass through the first positioning holes and the second positioning holes, respectively, so as to position the circuit board and the mounting bracket on the support table.

12. The positioning device according to claim 1, wherein:
    (a) the base has a positioning shaft,
    (b) the support table has a positioning hole, and
    (c) the positioning shaft passes through the positioning hole so as to position the support table on the base.

13. The positioning device according to claim 1, wherein the electronic device includes a light emitting diode.

* * * * *